US010957839B2

(12) United States Patent
Hoeksema

(10) Patent No.: US 10,957,839 B2
(45) Date of Patent: Mar. 23, 2021

(54) HEAT FLOW SENSOR AND METHOD OF MANUFACTURE THEREOF

(71) Applicant: Hukseflux Holding B.V., Delft (NL)

(72) Inventor: Eric Richard Hoeksema, The Hague (NL)

(73) Assignee: Hukseflux Holding B.V., Delft (NL)

( * ) Notice: Subject to any disclaimer, the term of this patent is extended or adjusted under 35 U.S.C. 154(b) by 0 days.

(21) Appl. No.: 16/502,058

(22) Filed: Jul. 3, 2019

(65) Prior Publication Data

US 2020/0013942 A1 Jan. 9, 2020

(30) Foreign Application Priority Data

Jul. 3, 2018 (NL) ...................................... 2021233

(51) Int. Cl.
| | |
|---|---|
| *H01L 35/32* | (2006.01) |
| *H01L 35/34* | (2006.01) |
| *G01K 7/02* | (2021.01) |
| *G01K 17/00* | (2006.01) |

(52) U.S. Cl.
CPC .............. *H01L 35/32* (2013.01); *G01K 7/02* (2013.01); *G01K 17/00* (2013.01); *H01L 35/34* (2013.01)

(58) Field of Classification Search
CPC ................................ H01L 35/32; H01L 35/34
See application file for complete search history.

(56) References Cited

U.S. PATENT DOCUMENTS

| | | | |
|---|---|---|---|
| 3,680,374 A | 8/1972 | Sumikama | |
| 2005/0105582 A1* | 5/2005 | Thery | G01K 17/00 |
| | | | 374/29 |
| 2011/0017431 A1* | 1/2011 | Yang | F28D 15/04 |
| | | | 165/104.26 |
| 2013/0215927 A1 | 8/2013 | Camberlein | |

FOREIGN PATENT DOCUMENTS

| | | |
|---|---|---|
| EP | 2902763 | 8/2015 |
| FR | 2704979 | 11/1994 |

* cited by examiner

*Primary Examiner* — Herve-Louis Y Assouman
(74) *Attorney, Agent, or Firm* — N.V. Nederlandsch Octrooibureau; Catherine A. Shultz; Katelyn J. Bernier

(57) ABSTRACT

Heat flow sensor comprising a thermopile with a series of thermocouples and having a first side and an opposite second side, a first electrically and thermally insulating layer arranged on the first side; a second electrically and thermally insulating layer arranged on the second side; a plurality of first thermally conductive pads spaced apart from the thermopile by the first layer and extending substantially parallel to the first side; a plurality of second thermally conductive pads spaced apart from the thermopile by the second layer and extending substantially parallel to second side; a plurality of thermally conductive first pillars, wherein each first pillar extends from one of said thermocouples at least partially into the first layer and is attached to a corresponding one of the first pads and has a length greater than a thickness of the corresponding first pad.

20 Claims, 6 Drawing Sheets

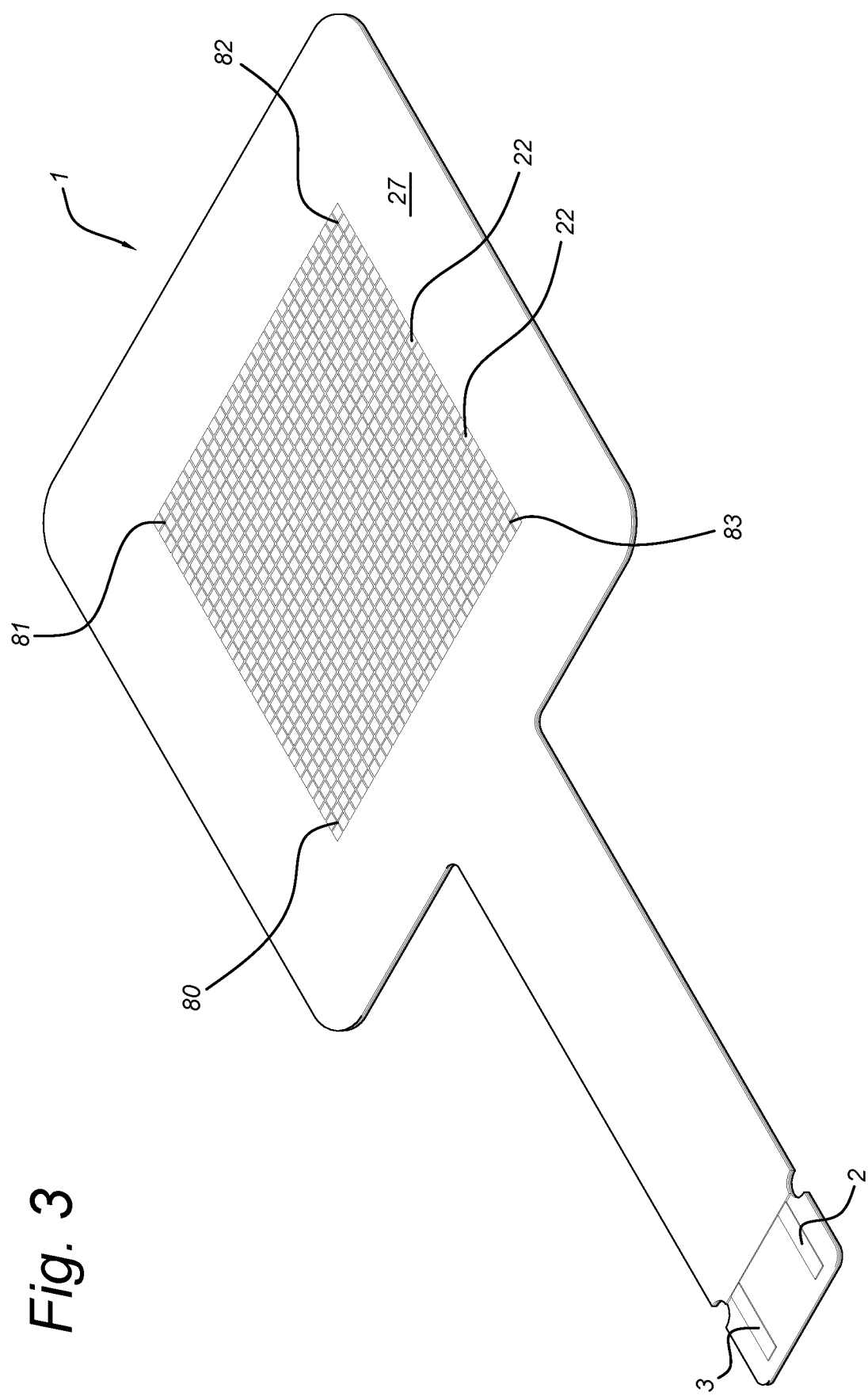

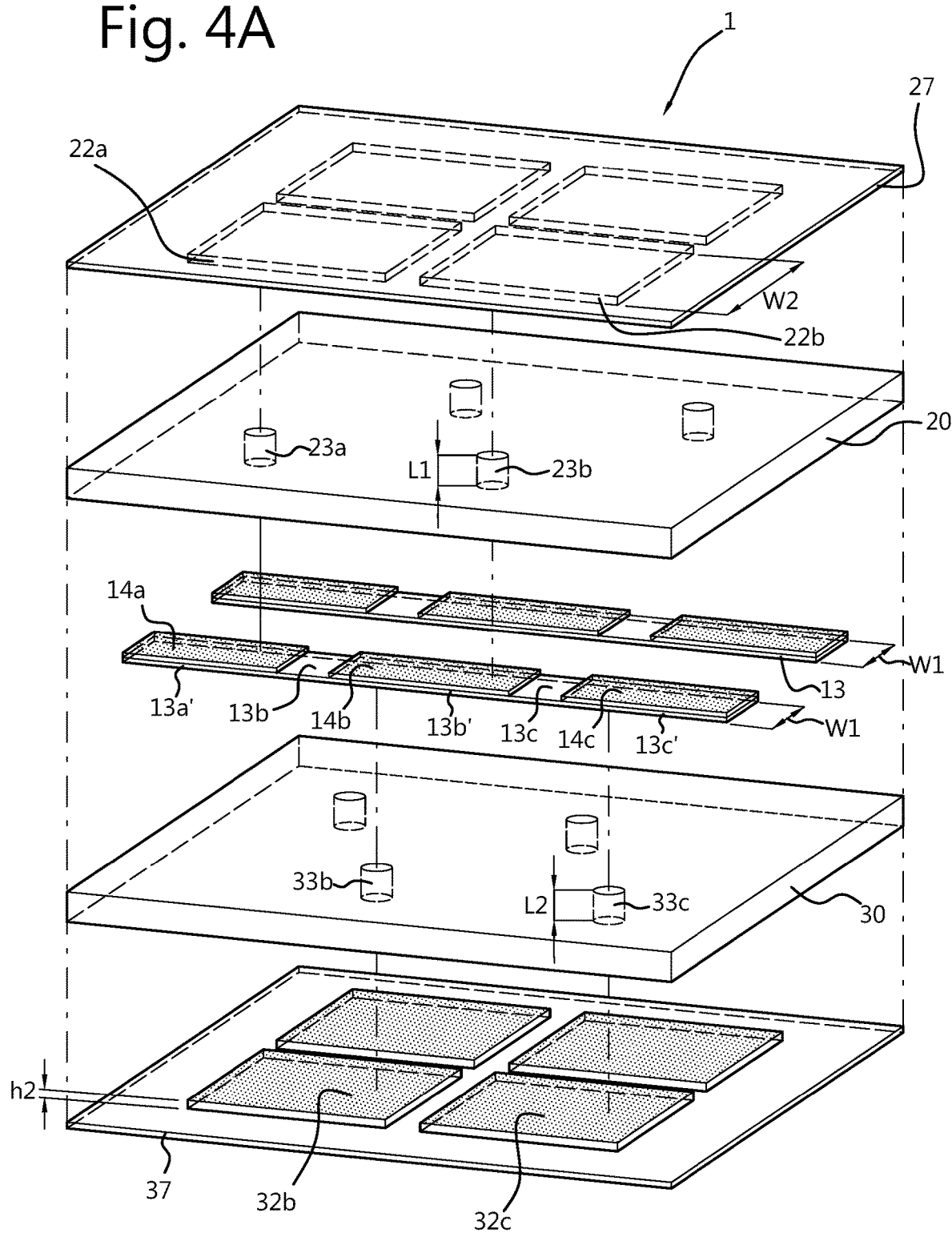

HEAT FLOW SENSOR AND METHOD OF MANUFACTURE THEREOF

FIELD OF THE INVENTION

Figure 1A:
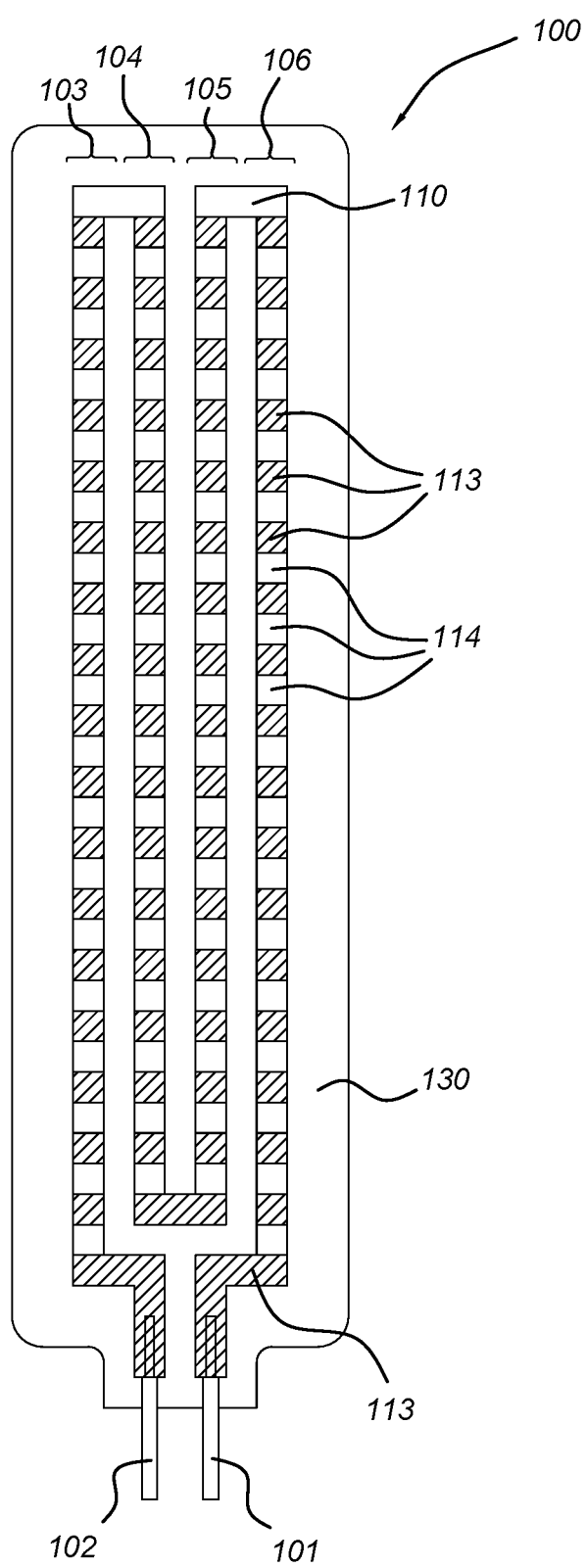

The present invention relates to a heat flow sensor comprising a thermopile comprising a plurality of thermocouples connected in series, the thermopile having a first side and an opposite second side substantially parallel to the first side, wherein each of the thermocouples is provided with a first portion of a first electrically conductive material and a second portion of a different second electrically conductive material and attached to the first portion; the heat flow sensor further comprising a first electrically and thermally insulating layer arranged on the first side; a second electrically and thermally insulating layer arranged on the second side; a plurality of first thermally conductive pads spaced apart from the thermopile by the first layer and extending substantially parallel to the first side; and a plurality of second thermally conductive pads spaced apart from the thermopile by the second layer and extending substantially parallel to second side. The invention further relates to a method of manufacturing a heat flow sensor.

BACKGROUND ART

A heat flux sensor is known from US 2005/0105582, which describes a thin heat flux comparator designed to receive a heat flux that is transmitted by contact, i.e. a conductive and/or convective heat flux, on each of its input faces. The known heat flux sensor comprises two substantially planar and mutually parallel input faces, capable of receiving each a heat flux, and comprises a thermoelectric circuit including at least a strip of a first metallic material partly covered on one of its surfaces with first separate metal pads of a second metallic material. The heat flux comparator also comprises layers of an electrically and thermally insulating material arranged on either side of the thermoelectric circuit, and second and third pads arranged on respective faces of the two layers of insulating material which are directed away from the thermoelectric circuit. The layers of insulating material have a same thickness. The second and third pads, which have a thermal conductivity greater than that of the layers of insulating material, and are preferably made of a same material, e.g. copper, have substantially a same thickness.

The known sensor's output depends significantly on the thermal conductivity of the material in which the sensor is used. For instance, when the sensor is attached to a material having a relatively high thermal conductivity, its output may differ significantly from when the sensor is attached to a material having a lower thermal conductivity, due to micro effects.

It is an object of the invention to provide a heat flow sensor which provides an output which is less susceptible to be influenced by micro-effects.

SUMMARY OF THE INVENTION

To this end, according to a first aspect the present invention provides a heat flow sensor comprising: a thermopile comprising a plurality of thermocouples connected in series, the thermopile having a first side and an opposite second side substantially parallel to the first side, wherein each of the thermocouples is provided with a first portion of a first electrically conductive material and a second portion of a different second electrically conductive material and attached to the first portion; a first electrically and thermally insulating layer arranged on the first side; a second electrically and thermally insulating layer arranged on the second side; a plurality of first thermally conductive pads spaced apart from the thermopile by the first layer and extending substantially parallel to the first side; a plurality of second thermally conductive pads spaced apart from the thermopile by the second layer and extending substantially parallel to the second side; a plurality of thermally conductive first pillars, wherein each first pillar extends from one of said thermocouples at least partially into the first layer and is attached to a corresponding one of the first pads and has a length greater than a thickness of the corresponding first pad; and a plurality of thermally conductive second pillars, wherein each second pillar extends from one of said thermocouples at least partially into the second layer and is attached to a corresponding one of the second pads and has a length greater a thickness of the corresponding second pad.

Each of the thermally conductive first and second pads is adapted for distributing energy incident thereon along the surface of the pad. As the pads are thermally connected to their corresponding thermocouples by a pillar, micro effects due to heat energy accumulating locally in the first and second pads, the first insulating layer, the second insulating layer and/or a material in which the sensor is embedded are considerably reduced. The micro effects are further reduced by the pads which together provide a large thermally conductive surface.

The transfer of heat energy from the first side of the sensor through the thermopile and to the second side, or vice versa, is thus less dependent on the thermal insulation properties of the first and second insulating layers and/or the material in which the sensor is embedded, resulting in the sensor's output being substantially less influenced by micro-effects. In many cases, this allows the sensor of the invention to be attached with its first or second side to an object, without requiring prior calibration of the sensor with respect to the material the object is made from. For instance, a same sensor may be used to carry out heat flux measurements on low-density fibrous insulants, e.g. having a density of less than 30 kg/m$^3$, and subsequently for carrying out heat flux measurements on high-density fibrous insulants, e.g. having a density of 80 to 100 kg/m$^3$, without having to recalibrate the sensor when it is switched from a location in which it is embedded in the low-density insulant to a location in which it is embedded in the high density insulant.

As the first and second pillars thermally respectively connect the first and second pads to the thermopile, the thermal resistance from the first side of the sensor to the second side of the sensor and vice versa is reduced, and flow of heat through the first and second insulating layer to the thermocouples is improved. Each pillar enables efficient transport of heat energy from a pad to which it is connected at one side of the thermopile, through a thermocouple of the thermopile, and then via a corresponding pillar on the opposite side of the sensor to a pad on said opposite side. As each of the first and second pads is thermally connected to a thermocouple of the thermopile, the amount of heat conducted through the thermocouples is increased, thus also increasing the output signal of the sensor per unit sensor area. This typically results in an improved signal to noise ratio and/or sensitivity of the sensor.

Preferably the first pads and/or the second pads are distributed equidistantly and/or are of substantially identical dimensions. Apart from their points of contact with the thermocouples, the pillars do not form part of the thermopile circuit.

The total contact surface between the pillars and the thermopile is preferably at least 2 times smaller, preferably at least 10 times smaller than the total area of the first and second portions of the thermocouples in the thermopile. Thus, even if a pillar is made of a material different than the material of the portion of the thermocouple it is connected to, the extent to which the pillar contributes to the electrical sensitivity of the sensor is insignificant when compared to the electrical contribution of the thermocouples to the sensitivity. In particular, for each thermocouple of the thermopile, the total area of the contact surface between the thermocouple and the pillars directly connected thereto, preferably is at least 5 times smaller, more preferably at least 10 times smaller, than the total area of the surface of the first and second portions of the thermocouple pads.

Each of the pads is adapted for distributing energy incident thereon along the surface of the pad. Preferably, the first and second pads, when projected onto the plane of the thermopile, substantially completely overlap each other. When such a sensor is flipped 180 degrees around its longitudinal axis, the sensor may produce a voltage of equal magnitude but opposite sign when compared to the voltage produced before the sensor was flipped.

The pillars on a same side of the thermopile are preferably connected at the same thermopile material transition. For example, if the first pillars are all connected at the transition of the first electrically conductive material to the second, then the second pillars may be connected at the transition from the second electrically conducting material to the first.

The number of first conductive pads is generally substantially equal to the number of thermocouples in the thermopile, with each thermocouple being connected to only one associated first conductive pad via one or more of the first pillars, wherein all of the one or more first pillars that are attached to said first conductive pad are attached to said thermocouple. More preferably, each first pillar is attached to only one first conductive pad, and each first conductive pad is attached to only one first pillar.

In a preferred embodiment every thermocouple is attached to one, preferably only one, first pillar and connected via said pillar to its corresponding first pad. Likewise, every thermocouple is preferably attached to one, preferably only one, second pillar and connected via said pillar to its corresponding second pad. Formation of electrically conducting loops between one of the pads and the thermopile is thus avoided.

The first and second layer of electrically and thermally insulating material preferably each have an outward facing side which faces away from the thermopile, wherein a distance between the two outward facing sides is 20 times or less than a length and/or width of each of the two layers. The insulating layers may be made of a film or foil, preferably a polyimide film such as Kapton®, or another film or foil having a dielectric constant of at least 4.0 as measured in accordance with ASTM D150-11, and having a thermal conductivity (in W/m*K) of 0.5 or less as measured in accordance with ASTM D5470-17.

Preferably, the second pillars are completely arranged at the second side of the thermopile, i.e. do not protrude through or from the first side. In particular it is preferred that the second pillars are completely spaced apart from the first insulating layer.

In an embodiment each thermocouple has a first thermal resistivity between its first pillar and its second pillar, wherein a second thermal resistivity is defined between the first pillar of said thermocouple and the closest second pillar of a thermocouple directly adjacent in the thermopile, wherein a largest of these thermal resistivities differs by no more than a predetermined percentage of 50% or less from the smallest of these thermal resistivities. For instance, if the first thermal resistivity is 1 Kelvin/Watt and the second thermal resistivity is 1.3 Kelvin/Watt, then the largest of these resistivities differs 30% from the smallest of these resistivities. Preferably the predetermined percentage is 20% or less, more preferably 10% or less, e.g. 5%. When a first and adjacent second thermocouple are arranged along a longitudinal direction, as is typically the case in the thermopile according to the invention, heat energy entering the first thermocouple through its corresponding first pillar can flow in two directions along the longitudinal direction. The smaller the difference in thermal resistivity in either of these directions, the greater the sensitivity in Kelvin/(Watt/m$^2$) of the thermocouple will be. An estimate of the first and second thermal resistivity may be calculated from the dimensions and the material properties of the thermocouple and pillars and/or by numerical simulation. Such estimates can typically be carried out with a margin of error of at most 10%. In particular lengths and widths of the first and second portions may be determined in this manner, and/or empirically, to ensure that the largest of the first and second thermal resistivity differs by no more that the predetermined percentage from the smallest of the first and second thermal resistivity. For ease of manufacturing it is preferred that the width of the first portions is substantially equal to the width of the second portions, and that the first portions all have substantially the same thickness and the second portions all have substantially the same thickness, and that the first and second thermal resistivities are determined for different lengths of the first and second portions. Typically, the length of the first portions is smaller, e.g. 70% or less, than the length of the second portions.

In an embodiment the first portion and second portion of each thermocouple have lengths and widths such that the largest of these thermal resistivities differs no more than said predetermined percentage from the smallest of these thermal resistivities.

In an embodiment the first pillar of each thermocouple is arranged at a center-to-center distance from a closest first pillar of an adjacent thermocouple along the thermopile such that the largest of these thermal resistivities differs no more than said predetermined percentage from the smallest of these thermal resistivities; and/or the second pillar of each thermocouple is arranged at a center-to-center distance from a closest second pillar of an adjacent thermocouple along the thermopile such that the largest of these thermal resistivities differs no more than said predetermined percentage from the smallest of these thermal resistivities. The center-to-center distance is equal between the first pillars and between the second pillars.

The first thermal resistivity depends, amongst others, on the distance between the first pillar of a thermocouple and the second pillar of the same thermocouple. The second thermal resistivity depends, amongst others, on the distance between the first pillar of the same thermocouple to a closest second pillar of another, directly adjacent, thermocouple. By suitably choosing these distances such that the difference between the largest and smallest of the first and second thermal resistivities is within the predetermined percentage, the sensitivity of a thermocouple can be optimized.

In an embodiment the first plurality of pillars is arranged at a position offset from the second plurality of pillars such that that the first thermal resistivity differs no more than said predetermined percentage from the second thermal resistivity. In this embodiment the first pillars are arranged at a substantially constant centre-to-centre distance from adjacent first pillars, and the second pillars are arranged at a substantially equal centre-to-centre distance from adjacent second pillars. By selecting the offset between the first and second plurality of pillars such that the largest of the first and second thermal resistivities differs by no more than the predetermined percentage from the smallest of the first and second thermal resistivities, the sensitivity of the thermocouples can be optimized.

In an embodiment the sensitivity of the sensor for heat flow from the first side to the second side is substantially equal to the sensitivity of the sensor for heat flow from the second side to the first side. Thus, flipping the sensor such that the first side and the second side are reversed results in an output signal of equal magnitude but opposite sign as before flipping the sensor. With regard to the sensitivity to the direction in which heat flows through the sensor, such a sensor may also be said to be symmetrical.

In an embodiment each of the first and/or second pads has a width greater than the corresponding width of the thermocouple to which it is attached via a pillar.

In embodiment, the first portions and second portions of the thermocouples are substantially planar and parallel to each other, wherein each thermocouple is adapted for generating an electrical signal indicative of the heat flow there through in a direction from the point of attachment of the first pillar to the point of attachment of the second pillar. The thermopile is thus adapted for providing an indication of the accumulation of electromotive force generated in all of the thermocouples when heat energy flows through each thermocouple from a cold junction, e.g. at the point of attachment of the thermocouple to one of the first or second pillars connected to the thermocouple, to a hot junction, e.g. at the point of attachment of the thermocouple to the other of the first or second pillars connected to the thermocouple.

In an embodiment, the plurality of thermocouples, when the thermopile is in a planar configuration, span a planar area having a length and width which are substantially greater than a maximum thickness of the thermopile in a direction normal to said planar area. The maximum thickness of the thermopile, in a direction normal to the length and width of the planar area spanned by the plurality of thermocouples, is preferably less than the smallest of one twentieth of said length and width. For instance, when the thermopile, within the area spanned by the plurality of thermocouples, has a maximum thickness of 0.2 mm, the length and width of the area spanned by the thermocouples will both be greater than 4 mm.

In an embodiment the first and second pillars are made from a material having an electrical conductivity greater than that of the material of which the first and second insulating layers are made. Each conductive pad is thus directly and electrically conductively connected via its corresponding pillar to its corresponding thermocouple. For instance, the pillars may be made from a metal or metal alloy, and the first and second insulating layers may be made from a plastic, such as Kapton®.

In an embodiment the plurality of thermocouples in series forms a conductive circuit having a start and an end and main branch extending therebetween, wherein each of the first pads and/or the second pads forms a dead end branch of the conductive circuit which can be disconnected from the conductive circuit without interruption of the conductive circuit from the start to the end. Thus, even if the first or second pads or their corresponding pillars are damaged, e.g. become detached from the corresponding thermocouples, the conductive circuit from start to end stays intact and the sensor may continue to be used to measure flow of heat. In this manner a sensor with improved robustness and reliability may be provided.

In an embodiment the heat flow sensor comprises a substantially planar strip of the first electrically conductive material, wherein the first portions of the thermocouples are part of the strip, and wherein the second portions are arranged on said conductive strip and spaced apart from each other. The strip may thus be formed as a single continuous strip, allowing the thermopile to be manufactured in a particularly convenient manner. For instance, the strip may be formed as a continuous, preferably meandering, strip from the first conductive material, e.g. constantan, on which portions of the second conductive material, e.g. copper, are deposited to form the second portions, wherein the deposited second portions are spaced apart from each other along the strip. The strip will generally meander and comprise a number of substantially parallel straight traces, each of the traces having a first end and a second end and multiple thermocouples connected in series therebetween, wherein the first end of a trace is connected to a second end of a neighbouring trace, so that the thermopile can span a planar area having an aspect ratio of between 1 and 4. In order to further facilitate easy of manufacture, the strip is preferably contiguous.

In an embodiment the heat flow sensor is a flexible foil-type heat flow sensor bendable between a substantially planar configuration and a non-planar configuration. In the non-planar configuration the sensor, or at least the thermopile thereof, may have a bending radius of 1 mm or more. Preferably, the thermopile extends substantially in or near a central plane of the sensor, so that shear stress on the thermopile when the sensor is in the non-planar configuration is minimized.

In an embodiment the first pillars extend from each thermocouple only on the first side of the thermopile, and/or wherein the second pillars extend from each thermocouple only on the second side of the thermopile. Each of the thermocouples may thus to be produced free from through holes and/or blind holes through which one or more of the pillars extend from the first to the second side of the thermopile.

In an embodiment, the pillars of the first plurality of pillars are arranged at a first center-to-center distance and the pillars of the second plurality of pillars are arranged at a second, substantially equal center-to-center distance from each other along the thermopile, and wherein an offset between the first and second plurality of pillars is at least 0.05 times said center-to-center distance. The length, width and/or thickness of the first portions of neighbouring thermocouples in the series of thermocouples may be unequal to the length, width and/or thickness of said second portions. By varying this length, width or thickness of the thermopile portions, and/or the center-to-center distance between the first and second plurality of pillars, the sensor's sensitivity may be optimized. The center-to-center distances are measured along the strip. For example take a thermopile in which second thermocouple portions are formed as copper portions locally deposited on the a constantan strip, wherein the first thermocouple portions are formed by those parts of the strip between two neighbouring and spaced apart second thermopile portions, and wherein the thickness of the copper second thermocouple portions is of half the thickness of the constantan first portions and the widths of the first and second portions are substantially equal. As the thermal conductivity of copper is about 20 times higher than of constantan, in order to maximise the sensitivity, the second thermocouple portions should be around 10 times longer than the first portions which space the copper second portions apart. The offset between first and second plurality of pillars then becomes 0.1 times the center-to-center distance. The offset is preferably less than 0.4 times the center-to-center distance.

In an embodiment, when viewed in projection onto a thermocouple, the first pillar extending from said thermocouple and the second pillar extending from said thermocouple are offset from each other, and preferably are completely spaced apart from each other. Thus, when heat flows through the sensor from a first side of the sensor to an opposite second side of the sensor, the route of least thermal resistance is first through the first pillar along the longitudinal direction of said first pillar, subsequently the thermocouple in a direction substantially normal to the first pillar and in the plane of the thermopile, and then through the second pillar along the longitudinal direction thereof. In this manner it is avoided that the heat energy flows substantially directly from the first pillar to the second pillar without passing through at least a major portion of the thermocouple.

In an embodiment the first and/or second pillars are substantially comprised, or consist of, a same material as the first or second pad they are attached to. For instance, the first pads and first pillars attached thereto, and/or the second pads and the second pillars attached thereto, may comprise copper, silver or aluminum, or an alloy of these. As each first and/or second pillar is thus substantially of a same material as the corresponding pad it is attached to, the pillars can easily be connected to the pads, in particular without forming a local thermocouple at the location where the pillar is joined to the pad. Moreover, strain on the connection due to differences in thermal expansion between the pillar and the corresponding pad, e.g. due to differences in composition thereof, may be substantially avoided.

In an embodiment the first electrically conductive material comprises a metal or a metal alloy, e.g. a nickel alloy such as constantan ($Cu_{55}Ni_{45}$) or manganin ($Cu_{86}Mn_{12}Ni_2$). During manufacture of the sensor, such a material can easily be attached to or deposited onto the first layer of electrically and thermally isolating material as a thin layer or strip, i.e. having a thickness of less than 1 mm, preferably equal to or less than 0.2 mm. Alternatively, the first insulating layer may initially be covered with a substantially contiguous layer of the metal or metal alloy, after which portions of the contiguous layer are removed by etching to produce a conductive strip which forms the basis of the thermopile, the strip preferably having a meandering shape.

In an embodiment the first electrically conductive material has a higher specific electrical resistance than the second electrically conductive material. When the first portions form part of a larger strip on which the second portions of the second material are deposited, the strip is preferably made from that material of the first and second material which has the higher electrical resistance.

In an embodiment, the first pads are completely spaced apart from the thermocouples, and/or the second pads are completely spaced apart from the thermocouples, preferably by a distance equal to the length of the first pillar resp. the second pillar of each thermocouple.

In an embodiment the first and/or second electrically and thermally insulating layer has a thermal conductivity that is at least 20 times smaller than a thermal conductivity of the respective first and/or second pads, and has a specific electrical conductance that is at least 100 times smaller than an electrical conductivity of the respective first and/or second pads. Preferably the first and second layers have substantially the same thermal and electrical conductivity.

In an embodiment the sensor, at least along the area spanned by the thermopile, has a bending radius greater than or equal to $1\times10^{-3}$ m. The sensor may be adapted for bending between a substantially planar configuration, in which the first and second pads are substantially planar and parallel to each other and the thermopile extends substantially along a plane therebetween, and a bent configuration, in which an angle between a tangent plane at a first point on the first side of the thermopile and a tangent plane at a different second point on the first side is at least 30 degrees, preferably at least 60 degrees.

In an embodiment the sensor, at least along the area spanned by the thermopile is a flexible sensor having a bending modulus of at least 40 MPa, and up to 1000 MPa as measured according to ASTM D 790-17.

In an embodiment, the electrically conductive materials of the thermopile cover at least 50% of the area spanned by the thermopile.

In an embodiment when viewed in projection onto a plane in which the thermopile extends, the sum of areas of the first pads is equal to or greater than 50%, preferably at least 80%, of the area spanned by the thermocouples of the thermopile. This area typically includes gaps between traces of the thermopile. Preferably the sum of the areas of the second pads is equal to or greater than 50%, preferably at least 80%, of the area spanned by the thermocouples of the thermopile when seen in said projection, wherein more preferably the sum of the area of the first pads is substantially equal to the sum of the area of the second pads. The first and/or second pads thus cover a large surface area of the thermopile, so that local accumulation of heat on the first and/or second side of the sensor is substantially avoided and micro-effects are reduced. The pads may form an almost uniform, though not contiguous, thermally conductive surface.

In an embodiment, when viewed in projection onto a plane in which the thermopile extends, the sum of the areas of the first pads is greater than the sum of the areas of the first and second portions of the plurality of thermocouples. Preferably, the sum of the areas of the second pads is greater than the sum of the areas of the first and second portions of the plurality of thermocouples. Thus, the first and/or second pads, when viewed in projection onto the plane in which the thermopile extends, can extend beyond the thermocouples of the thermopile. In particular, along the direction in which the thermocouples are connected in series, the first and/or second pads may have a width greater than the width of the corresponding thermocouple they are thermally connected to. In this manner, heat energy incident on the first side or second side of the sensor is distributed over a relatively large area and micro-effects are reduced. Additionally, in this way the sensitivity of the sensor is increased because heat flux from a larger area is forced though the pads, their corresponding pillars and through the thermocouples.

In an embodiment, when the sensor is in a substantially planar configuration and viewed in projection onto its central plane, the first pads completely overlap the second pads, and/or the second pads completely overlap the first pads. The first and/or second pads preferably also substantially completely overlap the respective thermocouples to which they are attached via the pillars.

According to a second aspect, the present invention provides a method of manufacturing a heat flow sensor, preferably a heat sensor according to the invention, comprising a thermopile having a plurality of thermocouples that are connected in series, the method comprising the steps of:

providing a first electrically and thermally insulating layer;

applying a strip of an electrically and thermally conductive material on the first layer;

applying, on the strip, on a side of said strip which faces away from the first insulating layer, a plurality of second portions of a second electrically conductive material different from the first electrically conductive material, wherein said second portions are spaced apart from each other, each first portion together an adjacent second portion thereon forming a thermocouple of a plurality of thermocouples, in this manner forming the thermopile;

applying a second layer of electrically and thermally insulating material on top of said thermopile so that the thermopile is arranged between the first and second insulating layers;

wherein the method further comprises, for each of said thermocouples:

creating a first aperture through the first insulating layer and a second aperture through the second insulating layer, both apertures debouching at the thermocouple;

filling said first and second aperture with a thermally conductive material to form a first and second pillar, wherein each of said pillars is attached to the thermocouple;

attaching a pad of a thermally conductive material to the first pillar, wherein said pad is spaced apart from the thermocouple by the first insulating layer through which the first aperture extends; and attaching a pad of a thermally conductive material to the second pillar, wherein said pad is spaced apart from the thermocouple by the second insulating layer through which the second aperture extends.

The heat flow sensor manufactured in this manner, with thermally conductive pads thermally conductively connected via pillars to thermocouples, is less susceptible to inaccuracies in measurement resulting from micro-effects occurring in the sensor. Moreover, the pads, pillars and thermopile together provide a path of low thermal resistivity from one side of the sensor through the thermopile to the other side of the sensor so that the absolute value of the output signal may be improved.

The thermopile is preferably manufactured as a substantially planar thermopile, using etching a plating technology from the "flex circuits" industry. This technology is extensively used in manufacture of thermopiles for pyranometers by leading manufacturers such as Hukseflux Thermal Sensors and Kipp & Zonen. The apertures are typically created by drilling, and the pillars may be formed in the apertures by using plating techniques known from the "flex circuits with plated through hole" industry.

In an embodiment all of pillars on a first side of said thermopile are made of a same material, and/or all pillars on a second side of said thermopile opposite to said first side are made of a same material, preferably wherein all pillars which are connected to the thermopile are made from a same material. All of the apertures in the first and/or second insulating layer are thus filled with a same material, allowing the pillars to be formed in a same manufacturing step.

In an embodiment the step of filling the first and second apertures comprises filling the apertures with only said thermally conductive material, preferably in a single step of plating the apertures with said thermally conductive material.

In an embodiment the thermally conductive material which forms the pillar is substantially a same material as the material of the portion of the thermocouple to which the pillar is attached. In this manner the connection between the pillar and the thermocouple is less susceptible to stress caused by uneven thermal expansion and/or differences in material composition, and is less likely to generate thermal offsets when measuring heat flux.

In an embodiment the first and second insulating layer comprise a flexible foil, preferably a polyimide foil. Preferably, the thermocouple itself is capable of bending along with first and second layer along a bending radius of 10 mm or more.

SHORT DESCRIPTION OF DRAWINGS

Figure 1B:
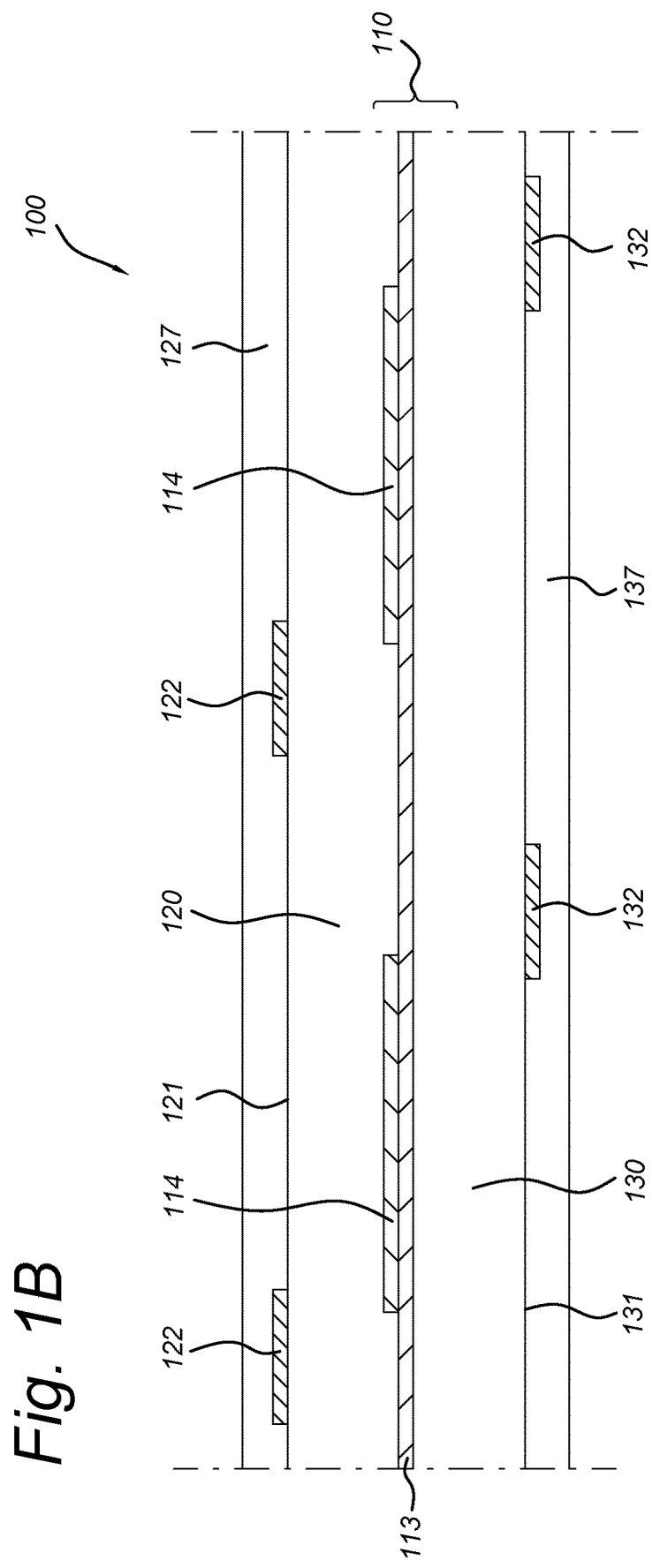
Figure 2:
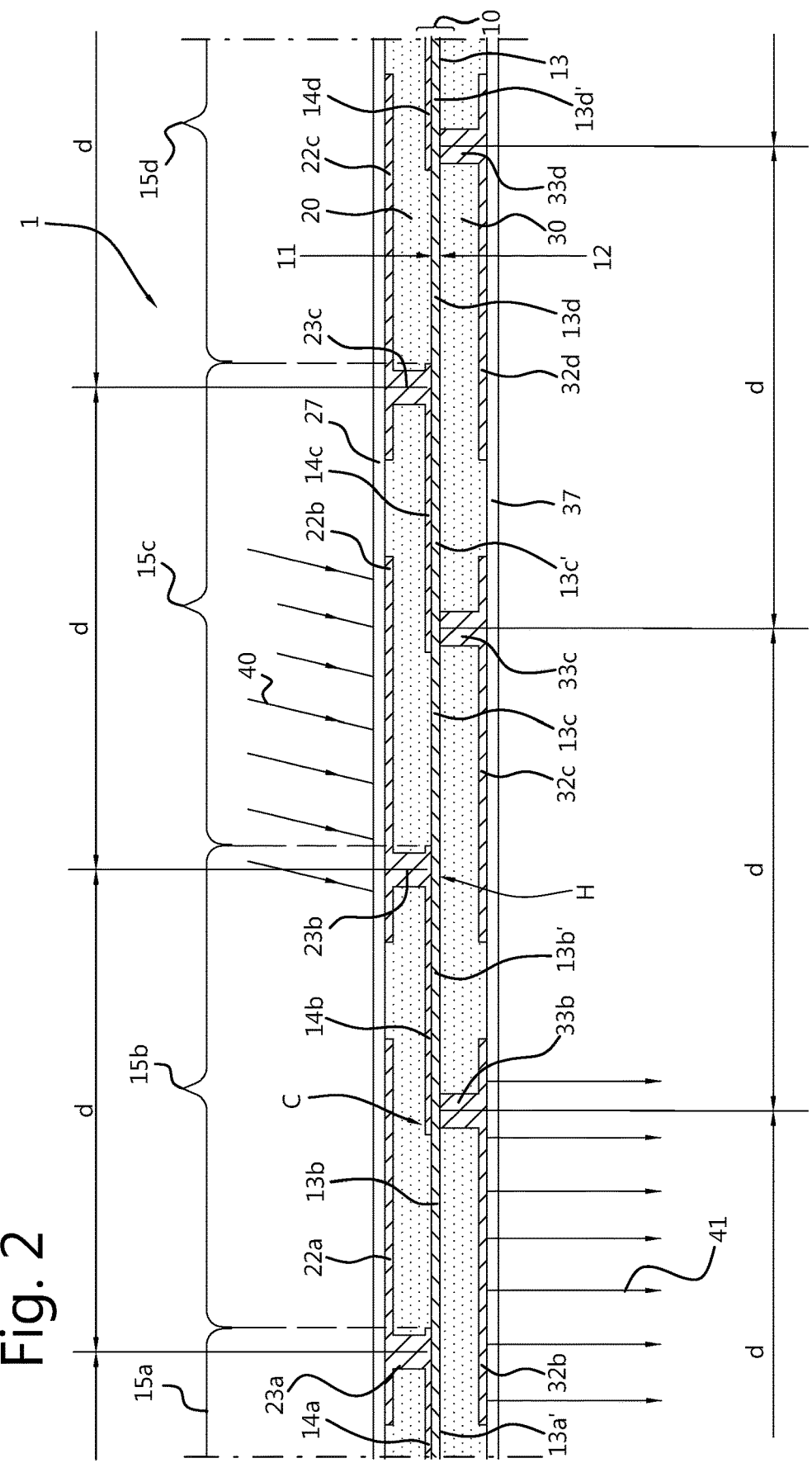
Figure 4B:
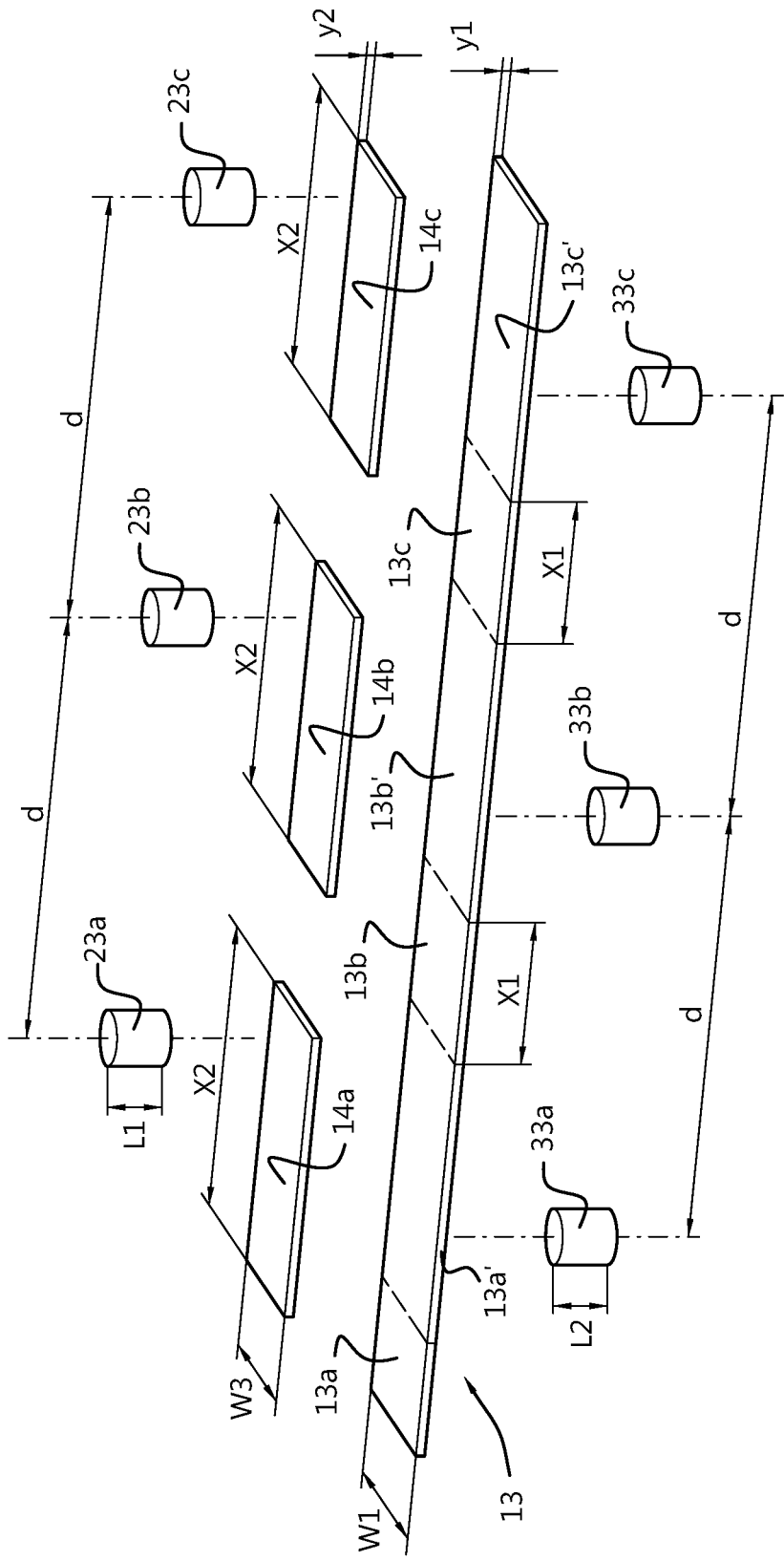

The present invention will be discussed in more detail below, with reference to the attached drawings, in which FIGS. 1A and 1B respectively show schematically a cross-sectional top view of a prior art heat sensor, and a longitudinal cross-sectional view of a portion of the same sensor, FIG. 2 schematically shows a cross-sectional view of a portion of a heat sensor according to the present invention, FIG. 3 shows a top view of a heat sensor of FIG. 2;

FIG. 4A shows an exploded view of a portion of the heat sensor shown in FIG. 2;

FIG. 4B schematically shows an exploded view of a portion of FIG. 4A.

DESCRIPTION OF EMBODIMENTS

FIGS. 1A and 1B respectively show schematically a top view of a prior art heat sensor 100, and a longitudinal cross-sectional view of the same in which a cross-section of a portion of the sensor's thermopile is visible. The sensor 100 comprises two thin flexible layers 120, 130 of a thermally and electrically insulating material. In order to better show the layout of the thermopile, the layer 120 and anything above this layer have not been shown in FIG. 1A, but the layers 120 and 130 are both shown in FIG. 1B. On top of the layer 130 a thermopile 110 is arranged, comprising a continuous and meandering strip 113 of constantan on which a plurality of portions 114 made of copper have been deposited. The copper portions 114 are arranged on the strip 113 and are spaced apart from each other along the strip 113. In the top view of FIG. 1A the portions of copper 114 are spaced apart from each other by portions of the strip 113. Together the constantan strip 113 and copper portions 114 form a thermopile comprising a plurality of thermocouples which are conductively connected in series along the strip. The strip has a meandering shape, with the thermocouples arranged in a number of substantially parallel traces 103, 104,105,106, each trace spaced being apart from its neighbouring trace(s) except at the ends of the trace. Flux of heat through the thermopile 110 can be measured as a voltage difference at terminals 101 and 102 of the sensor, which are connected to the ends portions of the strip.

FIG. 1B shows that on outer surfaces 121, 131 of the respective flexible layers 120, 130 which face away from the thermopile 110, aluminum radiation reflectors 122, 132 are arranged, respectively above and beneath the ends of the copper portions 114 along the longitudinal direction of the strip. The aluminum reflectors are adapted for at least partially reflecting radiation that is incident thereon away from the thermopile. Layers 127, 137 of a plastic material respectively cover the top side and the bottom side of layers 120 and 130 and the aluminum pad 122, 132 thereon. A similar heat sensor is shown in FIG. 1B of US patent application US 2005/01015582, which application is hereby incorporated in its entirety by reference.

FIG. 2 shows a longitudinal cross-sectional view of a portion of a heat flux sensor 1 according to the invention. The sensor 1 comprises a thermopile 10 which comprises a contiguous strip 13 substantially made of constantan, though another electrically well-conducting material may be used instead. The part of the strip 13 shown is partitioned into portions 13a',13b, 13b', 13c, 13c', 13d, 13d', of which portions 13b,13c,13d form respective first portions of thermocouples 15a,15b,15c,15d. The thermocouples 15b,15c, 15d further comprise respective second portion 14b,14c,14d of an electrically conductive material having a different electrical conductivity than the material of the strip 13, wherein each second portion has been deposited on the strip 13. The second portions 14b,14c,14d are deposited on portions 13b', 13c' and 13d' and spaced apart from each other on the strip 13 and extend parallel to the strip.

In the present example, the second portions 14a,14b,14c, 14d are made of copper which has a higher electrical conductivity than the first material of the strip 13. However, any other metal or a metal alloy having a different electrical conductivity than the first material may be used instead. The first portions 13b,13c and 13d and adjacent second portions 14b,14c,14d that are deposited on portions 13b', 13c' and 13d' of the strip thus form the thermocouples 15a,15b,15c, 15d of the thermopile which are connected in series.

The thermopile 10 has a first side 11 on which a first layer 20 of a thermally and electrically insulating material is arranged, and an oppositely facing second side 12 on which a second layer 30 of a thermally and electrically insulating material conductive material is arranged. In order to substantially prevent micro effects from occurring in the first layer 20, a plurality of first thermally conductive pads 22a,22b, 22c is provided in the first insulating layer 20, each of the pads 22a,22b,22c extending parallel to the thermopile 10. The first pads 22a,22b,22c distribute heat energy 40 incident thereon along each pad, in this manner reducing micro-effects in the sensor. Each of the first pads 22a,22b, 22c is electrically and thermally conductively connected to a corresponding thermocouple 15a,15b,15c pile by a respective first pillar 23a,23b,23c from an electrically and thermally conductive material. Each first pillar 23a,23b,23c extends from the thermopile 10 through a portion of the first insulating layer 20 and is attached to a corresponding first pad 22a,22b,22c, the pillar having a length greater than a thickness in the same direction of the pad to which the pillar is attached. Though in FIG. 2, only one pillar is attached to each pad, it is conceivable that two or more pillars are attached to a pad. Each first pillar 23a,23b,23c is made from a substantially same material as the portion of the thermocouple from which the pillar extends. In the present example, each first pillar 23a,23b,23c extends from a first portion 14a, 14b, 14c of a thermocouple of the thermopile, and thus also is made of copper. It will be appreciated that if the first portions of the thermocouples are made from another material, e.g. a nickel-free copper alloy or aluminum, then the first pillars are preferably made from that material instead. As the first pads 22a,22b,22c cover a substantial portion of the surface of the thermopile 10 and are thermally connected via the pillars 23a,23b,23c to the corresponding thermocouples, transfer of heat energy 40 from the first side 11 of the thermopile through the insulating layer 20 and to the thermopile 10 to be emitted as heat energy 41 at the second side, is significantly improved. This heat flow creates a hot joint H and a cold joint C of the thermocouple.

A layer 27 of a plastic electrically insulating material, preferably a same material as the material of first insulating layer 20, is applied on top of the first pads 22 and the first insulating layer 20. The layer 27, which in the present example is thinner than the insulating layer 20, prevents electrically conductive contact as well as direct thermal contact between the pads and objects or materials external to the sensor. In alternative embodiments the layer 27 may be thicker than the insulating later 20.

On the second side 12 of the thermopile 10 a plurality of second pads 32b,32c,32d is provided in the second insulating layer 30, with a layer 37 of plastic electrically insulating material covering the second pads 32b,32c,32d and the second insulating layer 30. When seen in projection onto a plane in which the planar top surfaces of the first pads extend, the first pads 22a,22b,22c and second pads 32b, 32c, 32d have substantially equal dimensions and substantially completely overlap each other. Each of the second pads 32b,32c,32d is attached to a respective second pillar 33b, 33c,33d which both thermally and electrically conductively connects the second pad 32a,32b,32c to a corresponding thermocouple 15b,15c,15d of the thermopile 10. Each second pillar 33b,33c,33d has a length greater than the thickness of the second pad 32b,32c,32d it is attached to. For instance, each first and/or second pillar may have a length in the ranges of 0.1 to 0.2 mm, and the respective first or second pad the pillar is connected to may have a thickness, along the length direction of the pillar, of 10 tenth or less of said length.

To prevent a flow of heat energy from the first side 11 to the second side 12 from substantially bypassing the thermocouples, and to maximize the absolute value of the thermopile output signal, the first pillars 23b,23c,23d, are offset from the corresponding second pillars 33b,33c,33d along the direction in which the strip 13 extends. In the embodiment shown, the length of the relatively well conducting second portions 14b, 14c,14c of the thermopiles is larger than the length of the first portions 13b,13c,13d along the direction of the strip 13.

An isometric view of a complete heat sensor 1 according to the invention, of which FIG. 2 shows is only a part, is shown in FIG. 3. Though not visible in the view of FIG. 3, the thermocouples of the thermopile span a substantially square area having corner points 80,81,82,83. The plurality of first thermally conductive pads 22 covers at least 50% of this area, in the present case about 75% thereof. As each of the first thermal pads 22 is thermally connected to the thermopile by a conductive first pillar 23, the pads aid in transferring heat energy from the exterior of the sensor 1 to the thermopile 10. Terminals 2 and 3 are connected to respective ends of the strip 13. The heat flow sensor 1 is embodied as a so-called foil heat flow sensor which can be applied on a substantially flat surface or on a curved surface such as a pipe for measuring flow of heat through or to said surface.

FIG. 4A schematically shows an exploded isometric view of a portion of the sensor 1, showing two parallel traces of the strip 13. Though not shown, these traces are connected to each other in series, in a manner similar shown in FIG. 1A. As can be seen, FIG. 4A shows thermocouples comprising copper second portions 14a,14b,14c deposited on portions 13a', 13b' 13c' of the constantan strip and attached to first portions 13b,13c of the thermocouples which are part of the strip. A second portion 14a,14b of each thermocouple is connected via a corresponding first pillar 23a,23b to corresponding first thermally conductive pad 22a,22b. The first portions 13b, 13c of the thermocouples are connected respectively via corresponding second pillars 33b, 33c to second thermally conductive pads 32b,32c. The first and second pads have a width w2 greater than the width w1 of the two traces of the strip 13, so that they also cover a portion of the sensor underneath which the strip 13 does not extend. The width and length of each of the pads 22a,22b however does not exceed 1.5 times the sum of the length of the first and second portions 13b,14b, 13c,14c of a thermocouple along the strip 13. In this manner, the pads cover a significant portion, i.e. 50% or more, of the area spanned by the thermocouples of the thermopile to reduce or prevent micro effects from occurring in the insulating layers 20, 30, while still allowing each thermocouple to be coupled to corresponding first and second pads and while allowing bending of the sensor.

FIG. 4B schematically shows an exploded view of the strip 13, first portions 13b,13c and second portions 14a,14b, 14 of FIG. 4A. The length L1 of each of the first pillars 23a,23b, 23c is at least 6 times greater than a sum of thicknesses y1 and y2, wherein y1 is the thickness of the strip 13, and y2 is the thickness of the second portions 14a,14b,14c to which the pillar is attached. Likewise, the length L2 of each of the second pillars is at least 6 times greater than these two thicknesses added together at the location which the second pillar is attached. Moreover, the area of the contact surface between each second pillar of a thermocouple and the thermopile is less than one third of the total area of the facing surface of the first portion of said thermocouple.

As the thermally conductive pads, which are typically also electrically conductive, form dead end branches of the electrical circuit to which the thermopile is connected, any damage to the pads or to the pillars connected thereto does not result in interruption of the electrical circuit between the series of thermocouples.

Two different thermal resistivities play an important role for each thermocouple. A first thermal resistivity may be defined between the first pillar 23b of the thermocouple comprising portions 13b and 14b, and the second pillar 33b of the same thermocouple. A second thermal resistivity may be defined between the first pillar 23b and a closest second pillar 33c of a thermocouple directly adjacent in the thermopile. These first and second resistivities can be set or varied by setting or varying the length and width of the first and second portions, in order to optimize the sensitivity of the sensor. For instance, a change in the length x1 of the first portions 13b, 13c, a change in the length x2 of the second portions 14a,14b,14c, and/or a change in the ratio of the length x2 of the second portions to the length x1 of the first portions 13b,13c, will change the first and/or second resistivity and thus the sensitivity of the sensor. Likewise, a change in width W1 of the strip 13 and/or a change in width W3 of the second portions will affect the sensitivity of the sensor. Lengths and widths for the first and second portions which maximized the sensitivity of the sensor can be estimated, e.g. in silico, and/or may be based on empirical data. In the embodiment shown, the lengths and width have been chosen such that the largest of first and second thermal resistivity differs by less than 30% from the smallest of these two resistivities.

In summary, the invention provides a heat flow sensor comprising a thermopile with a series of thermocouples and having a first side and an opposite second side, a first electrically and thermally insulating layer arranged on the first side; a second electrically and thermally insulating layer arranged on the second side; a plurality of first thermally conductive pads spaced apart from the thermopile by the first layer and extending substantially parallel to the first side; a plurality of second thermally conductive pads spaced apart from the thermopile by the second layer and extending substantially parallel to second side; a plurality of thermally conductive first pillars, wherein each first pillar extends from one of said thermocouples at least partially into the first layer and is attached to a corresponding one of the first pads and has a length greater than a thickness of the corresponding first pad. A plurality of second thermally conductive pads may be provided spaced apart from the thermopile by the second layer and extending substantially parallel to second side; wherein each second pillar extends from one of said thermocouples at least partially into the second layer and is attached to a corresponding one of the second pads and has a length greater than a thickness of the corresponding second pad.

The present invention has been described above with reference to a number of exemplary embodiments as shown in the drawings. Modifications and alternative implementations of some parts or elements are possible, and are included in the scope of protection as defined in the appended claims.

The invention claimed is:
1. Heat flow sensor comprising:
   a thermopile comprising a plurality of thermocouples connected in series, the thermopile having a first side and an opposite second side substantially parallel to the first side, wherein each of the thermocouples is provided with a first portion of a first electrically conductive material and a second portion of a different second electrically conductive material and attached to the first portion;
   a first electrically and thermally insulating layer arranged on the first side;
   a second electrically and thermally insulating layer arranged on the second side;
   a plurality of first thermally conductive pads spaced apart from the thermopile by the first electrically and thermally insulating layer and extending substantially parallel to the first side;
   a plurality of second thermally conductive pads spaced apart from the thermopile by the second electrically and thermally insulating layer and extending substantially parallel to the second side;
   a plurality of thermally conductive first pillars, wherein each first pillar extends from one of said thermocouples at least partially into the first electrically and thermally insulating layer and is attached to a corresponding one of the first pads and has a length greater than a thickness of the corresponding first pad; and
   a plurality of thermally conductive second pillars, wherein each second pillar extends from one of said thermocouples at least partially into the second electrically and thermally insulating layer and is attached to a corresponding one of the second pads and has a length greater a thickness of the corresponding second pad.

2. Heat flow sensor according to claim 1, wherein each thermocouple has a first thermal resistivity between its first pillar and its second pillar, and wherein a second thermal resistivity is defined between the first pillar of said thermocouple and the closest second pillar of a thermocouple directly adjacent in the thermopile, wherein a largest of these thermal resistivities differs by no more than a predetermined percentage of 50% or less from the smallest of these thermal resistivities.

3. Heat flow sensor according to claim 2, wherein:
   the first portion and second portion of each thermocouple have lengths and widths such that the largest of these thermal resistivities differs no more than said predetermined percentage from the smallest of these thermal resistivities;

the first pillar of each thermocouple is arranged at a center-to-center distance from a closest first pillar of an adjacent thermocouple along the thermopile such that the largest of these thermal resistivities differs no more than said predetermined percentage from the smallest of these thermal resistivities; and/or the second pillar of each thermocouple is arranged at a center-to-center distance from a closest second pillar of an adjacent thermocouple along the thermopile such that the largest of these thermal resistivities differs no more than said predetermined percentage from the smallest of these thermal resistivities.

4. Heat flow sensor according to claim 2, wherein the first plurality of pillars is arranged at a position offset from the second plurality of pillars such that the largest of these thermal resistivities differs no more than said predetermined percentage from the smallest of these thermal resistivities.

5. Heat flow sensor according to claim 1, wherein the plurality of thermocouples in series forms an electrically conductive circuit having a start and an end, wherein each of the first pads and/or the second pads with their respective pillars form a dead end branch of the conductive circuit which can be disconnected from the conductive circuit without interruption of the conductive circuit from the start to the end.

6. Heat flow sensor according to claim 1, wherein the first and second pillars are made from a material having a specific electrical conductance greater than that of the material of which the first and second electrically and thermally insulating layers are made.

7. Heat flow sensor according to claim 1, comprising a substantially planar strip of said first electrically conductive material, wherein the first portions of the thermocouples are part of the strip, and wherein the second portions are arranged on said conductive strip and spaced apart from each other.

8. Heat flow sensor according to claim 1, wherein the heat flow sensor is a flexible foil-type heat flow sensor bendable between a substantially planar configuration and a non-planar configuration.

9. Heat flow sensor according to claim 1, wherein the first pillars extend from each thermocouple only on the first side of the thermopile, and/or wherein the second pillars extend from each thermocouple only on the second side of the thermopile.

10. Heat flow sensor according to claim 1, wherein the pillars of the first plurality of pillars are arranged at a first center-to-center distance and the pillars of the second plurality of pillars are arranged at a second, substantially equal center-to-center distance from each other along the thermopile, and wherein an offset between the first and second plurality of pillars is at least 0.05 times said center-to-center distance.

11. Heat flow sensor according to claim 1, wherein, when viewed in projection onto a thermocouple, the first pillar extending from said thermocouple and the second pillar extending from said thermocouple are offset from each other, and preferably are completely spaced apart from each other.

12. Heat flow sensor according to claim 1, wherein the first and/or second electrically and thermally insulating layer has a thermal conductivity that is at least 20 times smaller than a thermal conductivity of the respective first and/or second pads, and has a specific electrical conductance that is at least 100 times smaller than a respective electrical conductivity of the first and/or second pads.

13. Heat flow sensor according to claim 1, wherein the sensor, at least along the area spanned by the thermopile, has a bending radius greater than or equal to $1 \times 10^{-3}$ m.

14. Heat flow sensor according to claim 1, wherein the sensor, at least along the area spanned by the thermopile is a flexible sensor having a bending modulus of at least 40 MPa, as measured according to ASTM D 790-17.

15. Heat flow sensor according to claim 1, wherein, when viewed in projection onto a plane in which the thermopile extends, the sum of areas of the first pads is equal to or greater than 50% of the area spanned by the thermocouples of the thermopile.

16. Heat flow sensor according to claim 1, wherein when viewed in projection onto a plane in which the thermopile extends, the sum of the areas of the first pads is greater than the sum of the areas of the first and second portions of the plurality of thermocouples.

17. Heat flow sensor according to claim 1, wherein, when the sensor is in a substantially planar configuration and viewed in projection onto its central plane, the first pads completely overlap the second pads, and/or the second pads completely overlap the first pads.

18. Method of manufacturing a heat flow sensor comprising a thermopile having a plurality of thermocouples that are connected in series, the method comprising the steps of:

providing a first electrically and thermally insulating layer;

applying a strip of an electrically and thermally conductive material on the first electrically and thermally insulating layer;

applying, on the strip, on a side of said strip which faces away from the first electrically and thermally insulating layer, a plurality of second portions of a second electrically conductive material different from the first electrically conductive material, wherein said second portions are spaced apart from each other, each first portion together an adjacent second portion thereon forming a thermocouple of a plurality of thermocouples, in this manner forming the thermopile;

applying a second layer of electrically and thermally insulating material on top of said thermopile so that the thermopile is arranged between the first electrically and thermally insulating layer and the second layer of electrically and thermally insulating material;

wherein the method further comprises, for each of said thermocouples:

creating a first aperture through the first electrically and thermally insulating layer and a second aperture through the second layer of electrically and thermally insulating material, both apertures debouching at the thermocouple;

filling said first and second aperture with a thermally conductive material to form a first and second pillar, wherein each of said pillars is attached to the thermocouple;

attaching a pad of a thermally conductive material to the first pillar, wherein said pad is spaced apart from the thermocouple by the first electrically and thermally insulating layer through which the first aperture extends; and attaching a pad of a thermally conductive material to the second pillar, wherein said pad is spaced apart from the thermocouple by the second layer of electrically and thermally insulating material through which the second aperture extends.

19. Method according to claim 18, wherein all of pillars on a first side of said thermopile are made of a same material, and/or wherein all pillars on a second side of said thermopile opposite to said first side are made of a same material, preferably wherein all pillars which are connected to the thermopile are made of a same material.

20. Method according to claim 18, wherein the step of filling the first and second apertures comprises filling the apertures with only said thermally conductive material, preferably in a single step of plating the apertures with said thermally conductive material.

* * * * *